United States Patent
Shinmura

(10) Patent No.: US 7,687,840 B2
(45) Date of Patent: Mar. 30, 2010

(54) CROSSPOINT STRUCTURE SEMICONDUCTOR MEMORY DEVICE, AND MANUFACTURING METHOD THEREOF

(75) Inventor: Naoyuki Shinmura, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 168 days.

(21) Appl. No.: 11/146,115

(22) Filed: Jun. 7, 2005

(65) Prior Publication Data

US 2005/0275003 A1 Dec. 15, 2005

(30) Foreign Application Priority Data

Jun. 10, 2004 (JP) ............................. 2004-172009

(51) Int. Cl.
*H01L 27/108* (2006.01)
*H01L 29/94* (2006.01)
(52) U.S. Cl. .................. 257/296; 257/288; 257/295; 438/197; 438/238; 438/239; 438/257; 365/158; 365/171; 365/189.09; 365/203
(58) Field of Classification Search .......... 257/288, 257/295, 296
See application file for complete search history.

(56) References Cited

U.S. PATENT DOCUMENTS

| | | | | |
|---|---|---|---|---|
| 6,080,624 | A * | 6/2000 | Kamiya et al. | 438/257 |
| 6,153,443 | A * | 11/2000 | Durlam et al. | 438/3 |
| 6,365,456 | B1 * | 4/2002 | Cereda et al. | 438/257 |
| 6,552,409 | B2 * | 4/2003 | Taussig et al. | 257/529 |
| 6,567,300 | B1 * | 5/2003 | Raberg et al. | 365/173 |
| 2001/0040819 | A1 | 11/2001 | Hayashi et al. | |
| 2003/0001178 | A1 | 1/2003 | Hsu et al. | |
| 2003/0003674 | A1 * | 1/2003 | Hsu et al. | 438/385 |
| 2003/0006428 | A1 * | 1/2003 | Palm et al. | 257/200 |
| 2003/0203585 | A1 * | 10/2003 | Hsu | 438/385 |
| 2004/0109363 | A1 | 6/2004 | Hamada | 365/200 |
| 2005/0104146 | A1 * | 5/2005 | Nickel et al. | 257/421 |

FOREIGN PATENT DOCUMENTS

| | | |
|---|---|---|
| JP | 2001-156263 | 6/2001 |
| JP | 2001-273757 | 10/2001 |
| JP | 2003-197877 | 7/2003 |
| JP | 2003-282837 | 10/2003 |

\* cited by examiner

*Primary Examiner*—Lynne A. Gurley
*Assistant Examiner*—Meiya Li
(74) *Attorney, Agent, or Firm*—Nixon & Vanderhye, PC

(57) ABSTRACT

A crosspoint structure semiconductor memory device includes a plurality of upper electrode interconnectings extending in the same direction and a plurality of lower electrode interconnectings extending in a direction orthogonal to the extension direction of the upper electrode interconnectings. A storage material member that stores data is formed between the upper electrode interconnectings and the lower electrode interconnectings. At least either the upper electrode interconnectings or the lower electrode interconnectings are formed along sidewall surfaces of projections formed into stripes of an insulation film processed to have the projections.

6 Claims, 24 Drawing Sheets

X1-X1'
Cross-sectional View

X2-X2'
Cross-sectional View

Y1-Y1'
Cross-sectional View

Y2-Y2'
Cross-sectional View

X1-X1'
Cross-sectional View

X2-X2'
Cross-sectional View

Y1-Y1'
Cross-sectional View

Y2-Y2'
Cross-sectional View

X1-X1'
Cross-sectional View

X2-X2'
Cross-sectional View

Y1-Y1'
Cross-sectional View

Y2-Y2'
Cross-sectional View

X1-X1'
Cross-sectional View

X2-X2'
Cross-sectional View

Y1-Y1'
Cross-sectional View

Y2-Y2'
Cross-sectional View

X1-X1'
Cross-sectional View

X2-X2'
Cross-sectional View

Y1-Y1'
Cross-sectional View

Y2-Y2'
Cross-sectional View

X1-X1'
Cross-sectional View

X2-X2'
Cross-sectional View

Y1-Y1'
Cross-sectional View

Y2-Y2'
Cross-sectional View

X1-X1'
Cross-sectional View

X2-X2'
Cross-sectional View

Y1-Y1'
Cross-sectional View

Y2-Y2'
Cross-sectional View

X1-X1'
Cross-sectional View

X2-X2'
Cross-sectional View

Y1-Y1'
Cross-sectional View

Y2-Y2'
Cross-sectional View

X1-X1'
Cross-sectional View

X2-X2'
Cross-sectional View

Y1-Y1'
Cross-sectional View

Y2-Y2'
Cross-sectional View

X1-X1'
Cross-sectional View

X2-X2'
Cross-sectional View

Y1-Y1'
Cross-sectional View

Y2-Y2'
Cross-sectional View

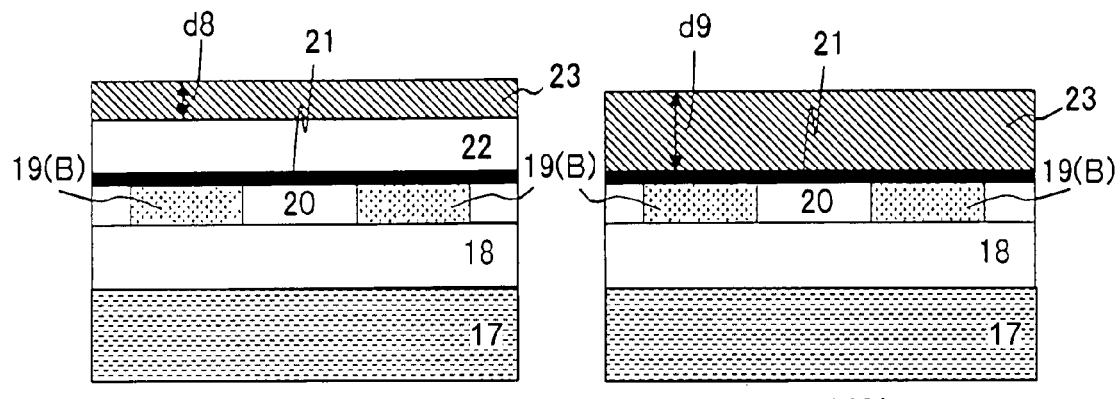
X1-X1'
Cross-sectional View
Fig.15A
X2-X2'
Cross-sectional View
Fig.15B
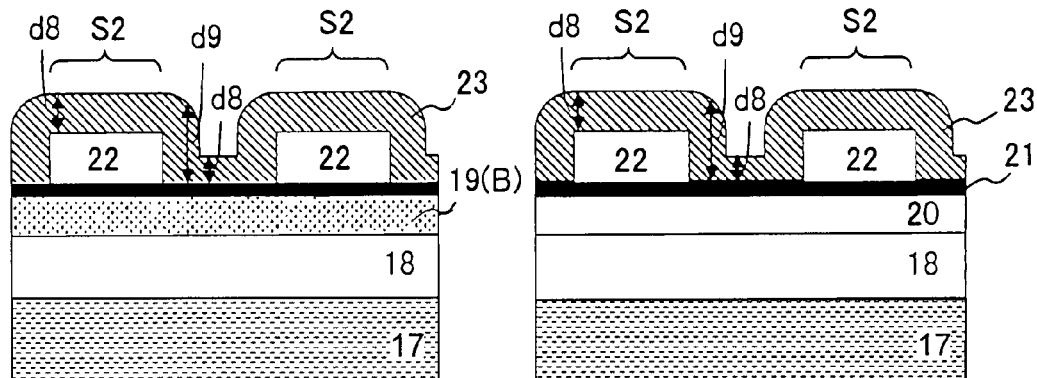
Y1-Y1'
Cross-sectional View
Fig.15C
Y2-Y2'
Cross-sectional View
Fig.15D

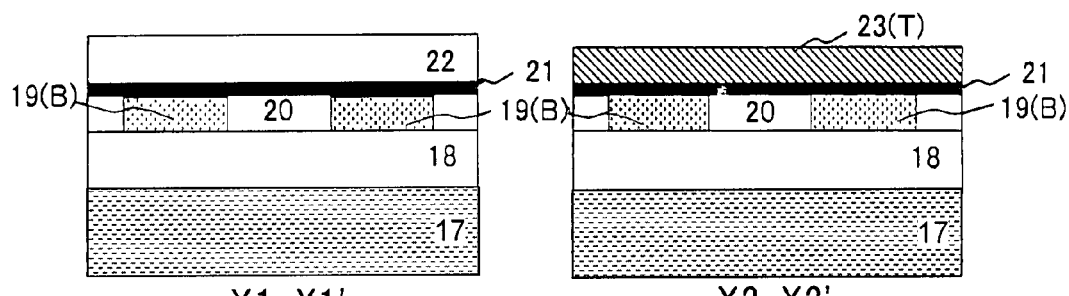
X1-X1'
Cross-sectional View
Fig.16A
X2-X2'
Cross-sectional View
Fig.16B
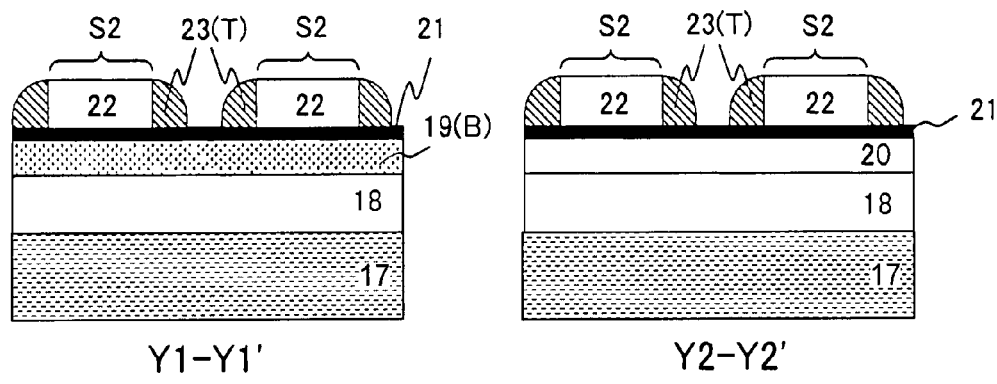
Y1-Y1'
Cross-sectional View
Fig.16C
Y2-Y2'
Cross-sectional View
Fig.16D X1-X1'
Cross-sectional View X2-X2'
Cross-sectional View Y1-Y1'
Cross-sectional View Y2-Y2'
Cross-sectional View X1-X1'
Cross-sectional View X2-X2'
Cross-sectional View Y1-Y1'
Cross-sectional View Y2-Y2'
Cross-sectional View X1-X1'
Cross-sectional View X2-X2'
Cross-sectional View Y1-Y1'
Cross-sectional View Y2-Y2'
Cross-sectional View X1-X1'
Cross-sectional View Y1-Y1'
Cross-sectional View

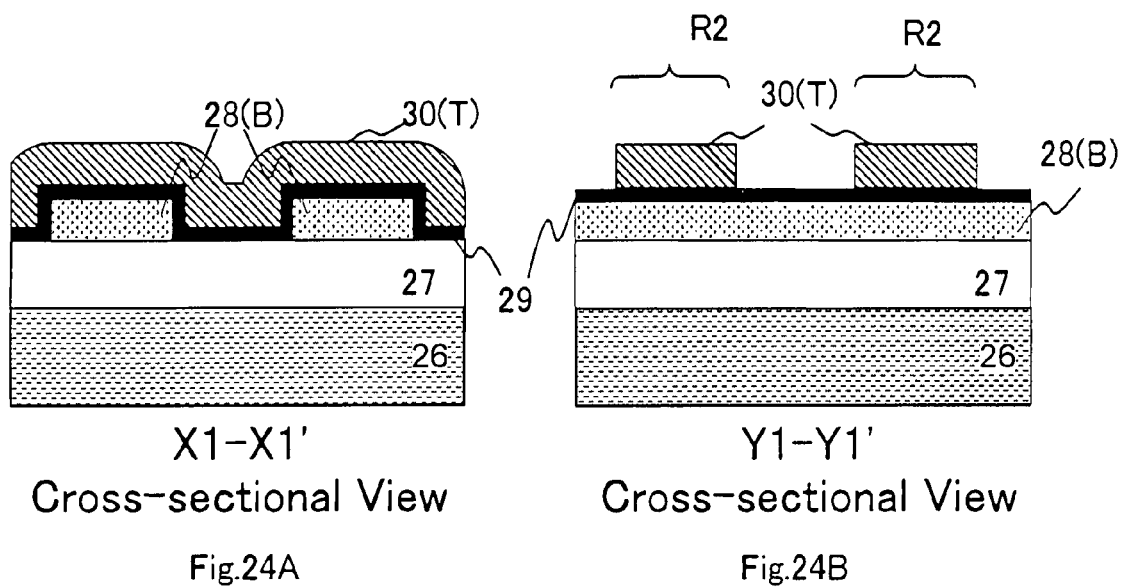
Fig.24A X1-X1' Cross-sectional View
Fig.24B Y1-Y1' Cross-sectional View
PRIOR ART

CROSSPOINT STRUCTURE SEMICONDUCTOR MEMORY DEVICE, AND MANUFACTURING METHOD THEREOF

CROSS REFERENCE TO RELATED APPLICATION

This Nonprovisional application claims priority under 35 U.S.C. §119(a) on Patent Application No. 2004-172009 filed in Japan on Jun. 10, 2004, the entire contents of which are hereby incorporated by reference.

BACKGROUND OF THE INVENTION

1. Field of the Invention

The present invention relates to a crosspoint structure semiconductor memory device including a plurality of upper electrode interconnectings extending in the same direction and a plurality of lower electrode interconnectings extending in a direction orthogonal to the extension direction of the upper electrode interconnectings, and having a storage material member for storing data formed between the upper electrode interconnectings and the lower electrode interconnectings, and to a manufacturing method thereof.

2. Description of the Related Art

Generally, in a semiconductor memory device such as a dynamic random access memory (DRAM), a NOR flash memory, or an ferroelectric random access memory (FeRAM), one memory cell is configured by a memory element section that stores data and a selection transistor that selects one memory element. A crosspoint structure memory cell, by contrast, includes only a storage material member that stores memory data in a crosspoint between a bit line and a word line without using the selection transistor. With the configuration of this crosspoint structure memory cell, the data stored in the crosspoint between a selected bit line and a selected word line is directly read without using the selection transistor. The crosspoint structure memory cell has disadvantages such as a delay in operating rate caused by a parasitic current carried from unselected memory cells connected to the same bit line or word line as that to which the selected memory cell is connected and an increase in power consumption. However, attention has been paid to the crosspoint structure memory cell since this simple structure can ensure a large capacity. Further, there have been proposed semiconductor memory devices including crosspoint structure memory cells such as a magnetic RAM or MRAM (magnetoresistive random access memory), a FeRAM (ferroelectric random access memory), and a RRAM (resistance random access memory). The MRAM is a nonvolatile memory that stores data using a ferromagnetic tunneling magnetoresistance effect (tunneling magnetoresistance or TMR effect) exhibited by the storage material member of the memory cell, that is, using a resistance change due to difference in magnetization direction. The FeRAM is a nonvolatile memory that stores data using a ferroelectric property exhibited by the storage material member of the memory cell, that is, using a difference in residual polarization among electric fields. The RRAM is a nonvolatile memory that stores data using a colossal magnetoresistance effect (colossal magnetoresistance or CMR effect) exhibited by the storage material member of the memory cell, that is, using an effect of the resistance change among electric fields.

For instance, JP-A 2001-273757 discloses an MRAM including crosspoint structure memory cells in FIG. 2 and the like. JP-A 2003-288784 discloses a FeRAM including crosspoint structure memory cells in FIG. 2 and the like. JP-A 2003-68983 discloses an RRAM including crosspoint structure memory cells in FIG. 6 and the like.

A simplest conventional method for manufacturing the crosspoint structure semiconductor memory device will be described. FIG. 22 is a layout plan view that shows a configuration of a conventional memory cell having a crosspoint structure. In FIG. 22, reference symbol R1 denotes a region that defines a interconnecting pattern of lower electrode interconnectings B and reference symbol R2 denotes a region that defines a interconnecting pattern of upper electrode interconnectings T. It is noted that either the upper electrode interconnectings T or the lower electrode interconnectings B serve as word lines and that the other interconnectings serve as bit lines. FIGS. 23A, 23B, 24A, and 24B show the conventional manufacturing method in order of steps. FIGS. 23A and 24A are vertical cross-sectional views taken along line X-X' of FIG. 22 and FIGS. 23B and 24B are vertical cross-sectional views taken along line Y-Y' of FIG. 22.

First, an interlayer insulation film 27 under a memory cell is formed on a silicon semiconductor substrate 26. Next, a first electrode film 28 that becomes the lower electrode interconnectings B is deposited on an entire surface of the interlayer insulation film 27, and then etched by well-known photolithography using a resist patterned into a stripe as a mask. The lower electrode interconnecting pattern R1 is thereby formed as shown in FIGS. 23A and 23B.

A storage material member 29 that stores data is formed on the entire surface. Namely, if a FeRAM is to be manufactured, a material film that exhibits the ferroelectric property is formed. If an MRAM is to be manufactured, a material film that exhibits the ferromagnetic tunneling magnetoresistance effect is formed. If an RRAM is to be manufactured, a material film that exhibits the colossal magnetoresistance effect is formed.

Subsequently, a second electrode film 30 that becomes the upper electrode interconnectings T is deposited on the entire surface of the storage material member 29, and then etched by the well-known photolithography using a resist patterned into a stripe as a mask. The upper electrode interconnecting pattern R2 is thereby formed as shown in FIGS. 24A and 24B.

As described above, each crosspoint structure memory cell does not include a selection transistor, so that it is possible to highly integrate crosspoint structure memory cells. According to the conventional manufacturing method, with a view of realizing the high integration, each of the upper electrode interconnecting pattern and the lower electrode interconnecting pattern is formed into stripes (lines and spaces) periodically repeated according to a minimum processing dimension specified under a device rule of a manufacturing process normally used to manufacture the semiconductor memory device (a possible minimum line width and a possible minimum space under a manufacturing process restriction). In addition, the upper electrode interconnecting pattern and the lower electrode interconnecting pattern are arranged to be orthogonal to each other. It is noted that the minimum processing dimension is a dimension normally restricted by a photolithographic resolution.

In the crosspoint structure memory, a region (crosspoint) in which the upper electrode interconnecting and the lower electrode interconnecting cross each other is a part that functions as one memory cell. In the layout plan view of the memory cells formed by the conventional manufacturing method shown in FIG. 22, the crosspoints (memory cells) are repeatedly present each at a pitch 2F in an array in a lower electrode interconnecting direction and an upper electrode interconnecting direction, where "F" is the minimum processing dimension. An area of one memory cell is, therefore, $2F \times 2F = 4F^2$ as indicated by a bold solid line region shown in FIG. 22. The conventional manufacturing method has, therefore, a disadvantage in that the memory cell area cannot be set smaller than $4F^2$ in theory.

SUMMARY OF THE INVENTION

The present invention has been achieved in view of the conventional disadvantages. It is an object of the present invention to provide a semiconductor memory device that can ensure a memory cell area smaller than a minimum memory cell area specified by the minimum processing dimension in a manufacturing process, and a manufacturing method thereof.

In order to achieve the above object, according to one aspect of the present invention, there is provided a crosspoint structure semiconductor memory device comprising: a plurality of upper electrode interconnectings extending in the same direction; and a plurality of lower electrode interconnectings extending in a direction orthogonal to the extension direction of the upper electrode interconnectings, a storage material member that stores data being formed between the upper electrode interconnectings and the lower electrode interconnectings, wherein at least either the upper electrode interconnectings or the lower electrode interconnectings are formed along sidewall surfaces of projections formed into stripes of an insulation film processed to have the projections.

In the crosspoint structure semiconductor memory device according to the present invention, the lower electrode interconnectings are formed along sidewall surfaces of projections formed into stripes of a first insulation film processed to have the projections, and the upper electrode interconnectings are formed along sidewall surfaces of projections formed into stripes of a second insulation film processed to have the projections.

In the crosspoint structure semiconductor memory device according to the present invention, more preferably, the storage material member exhibits a ferroelectric property, a ferromagnetic tunneling magnetoresistance effect, or a colossal magnetoresistance effect.

In order to achieve the above object, according to another aspect of the present invention, there is provided a method for manufacturing a crosspoint structure semiconductor memory device, the crosspoint structure semiconductor memory device comprising a plurality of upper electrode interconnectings extending in the same direction and a plurality of lower electrode interconnectings extending in a direction orthogonal to the extension direction of the upper electrode interconnectings, a storage material member that stores data being formed between the upper electrode interconnectings and the lower electrode interconnectings, the method comprising the steps of: depositing a first insulation film on a semiconductor substrate; processing the first insulation film, thereby forming projections into stripes; depositing a first electrode film that becomes a material for the lower electrode interconnectings; and etching the first electrode film, thereby forming the lower electrode interconnectings including the first electrode film along sidewall surfaces of the projections of the first insulation film.

According to still another aspect of the present invention, there is provided a method for manufacturing a crosspoint structure semiconductor memory device, the crosspoint structure semiconductor memory device comprising a plurality of upper electrode interconnectings extending in the same direction and a plurality of lower electrode interconnectings extending in a direction orthogonal to the extension direction of the upper electrode interconnectings, a storage material member that stores data being formed between the upper electrode interconnectings and the lower electrode interconnectings, the method comprising the steps of: depositing a second insulation film on the lower electrode interconnectings; processing the second insulation film, thereby forming projections into stripes; depositing the storage material member; depositing a second electrode film that becomes a material for the upper electrode interconnectings; and etching the second electrode film, thereby forming the upper electrode interconnectings including the second electrode film along sidewall surfaces of the projections of the second insulation film.

According to yet another aspect of the present invention, there is provided a method for manufacturing a crosspoint structure semiconductor memory device, the crosspoint structure semiconductor memory device comprising a plurality of upper electrode interconnectings extending in the same direction and a plurality of lower electrode interconnectings extending in a direction orthogonal to the extension direction of the upper electrode interconnectings, a storage material member that stores data being formed between the upper electrode interconnectings and the lower electrode interconnectings, the method comprising the steps of: depositing the storage material member on the lower electrode interconnectings; depositing a second insulation film; processing the second insulation film, thereby forming projections into stripes; depositing a second electrode film that becomes a material for the upper electrode interconnectings; and etching the second electrode film, thereby forming the upper electrode interconnectings including the second electrode film along sidewall surfaces of the projections of the second insulation film.

In the method according to the present invention, more preferably, the lower electrode interconnectings are formed in a self-aligned manner by etching the first electrode film and, further, the first electrode film is etched by reactive ion etching.

In the method according to the present invention, more preferably, the upper electrode interconnectings are formed in a self-aligned manner by etching the second electrode film and, further, the second electrode film is etched by reactive ion etching.

In the method according to the present invention, more preferably, at least one of a processing pattern of the first insulation film having the stripe projections and a processing pattern of the second insulation film having the stripe projections is formed according to processing dimensions having a minimum line width and a minimum space in a manufacturing process for the semiconductor memory device.

BRIEF DESCRIPTION OF THE DRAWINGS

FIGS. 15A to 15D are cross-sectional views that show part of steps of manufacturing the memory cells and the memory cell array of the semiconductor memory device according to the second embodiment of the present invention;

FIGS. 16A to 16D are cross-sectional views that show part of steps of manufacturing the memory cells and the memory cell array of the semiconductor memory device according to the second embodiment of the present invention;

FIGS. 24A and 24B are cross-sectional views that show part of steps of manufacturing the memory cells and the memory cell array of the crosspoint structure memory by the conventional manufacturing method.

DETAILED DESCRIPTION OF THE INVENTION

Embodiments of a semiconductor memory device and a manufacturing method thereof according to the present invention will be described hereinafter in detail with reference to the drawings. In the present specification, a RRAM configured to include crosspoint structure memory cells and a memory cell array using a CMR material having a colossal magnetoresistance effect (e.g., $Pr_{0.7}Ca_{0.3}MnO_3$ or PCMO) will be described as an example of the semiconductor memory device according to the present invention. In addition, a memory cell configuration of the RRAM and a specific method for manufacturing the RRAM will be described.

First Embodiment

A first embodiment in which the method for manufacturing the semiconductor memory device according to the present invention (hereinafter, sometimes referred to as "the inventive method") is applied to formation of upper electrode interconnectings and lower electrode interconnectings for crosspoint structure memory cells will be described.

Figure 1:
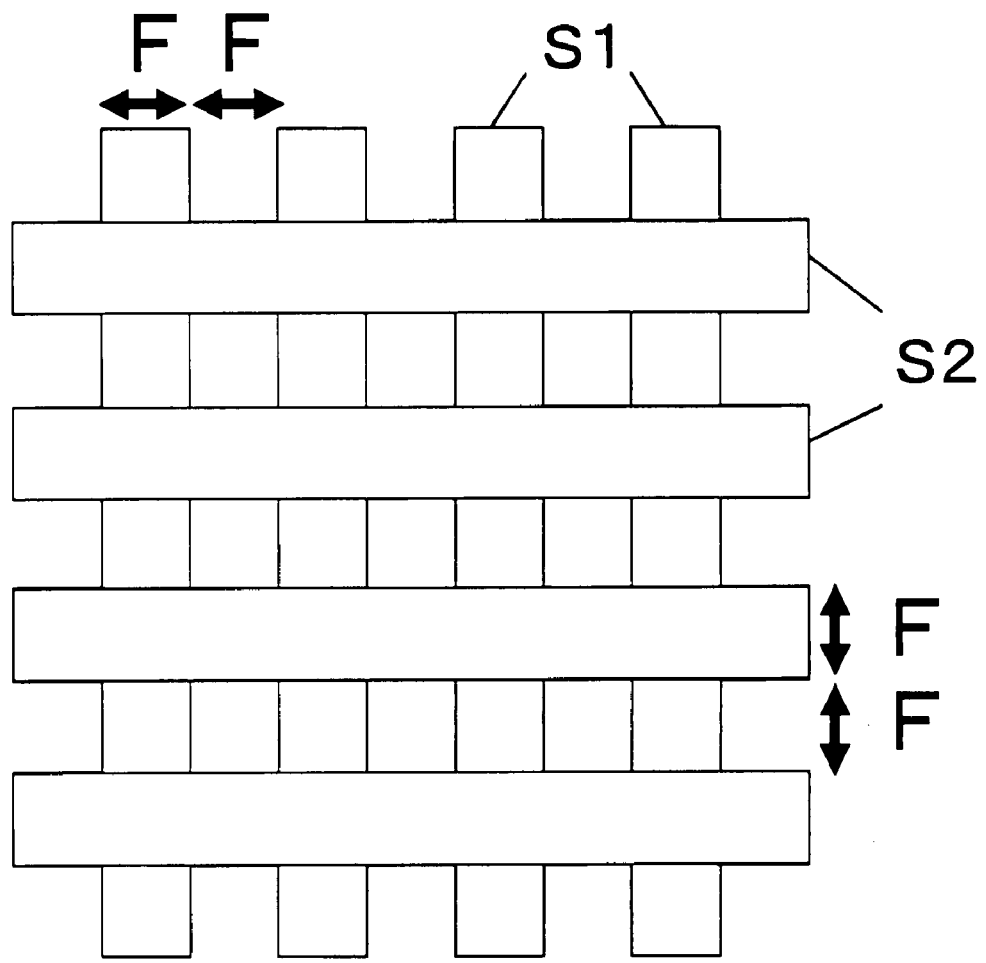
FIG. 1 is a layout plan view for forming memory cells and a memory cell array of a semiconductor memory device according to a first embodiment of the present invention.

FIG. 1 is a layout plan view for forming memory cells and a memory cell array by the inventive method. In FIG. 1, reference symbol S1 denotes a region that defines a first insulation film pattern necessary to form lower electrode interconnectings B (see FIG. 2). Reference symbol S2 denotes a region that defines a second insulation film pattern necessary to form upper electrode interconnectings T (see FIG. 2).

Figure 2:
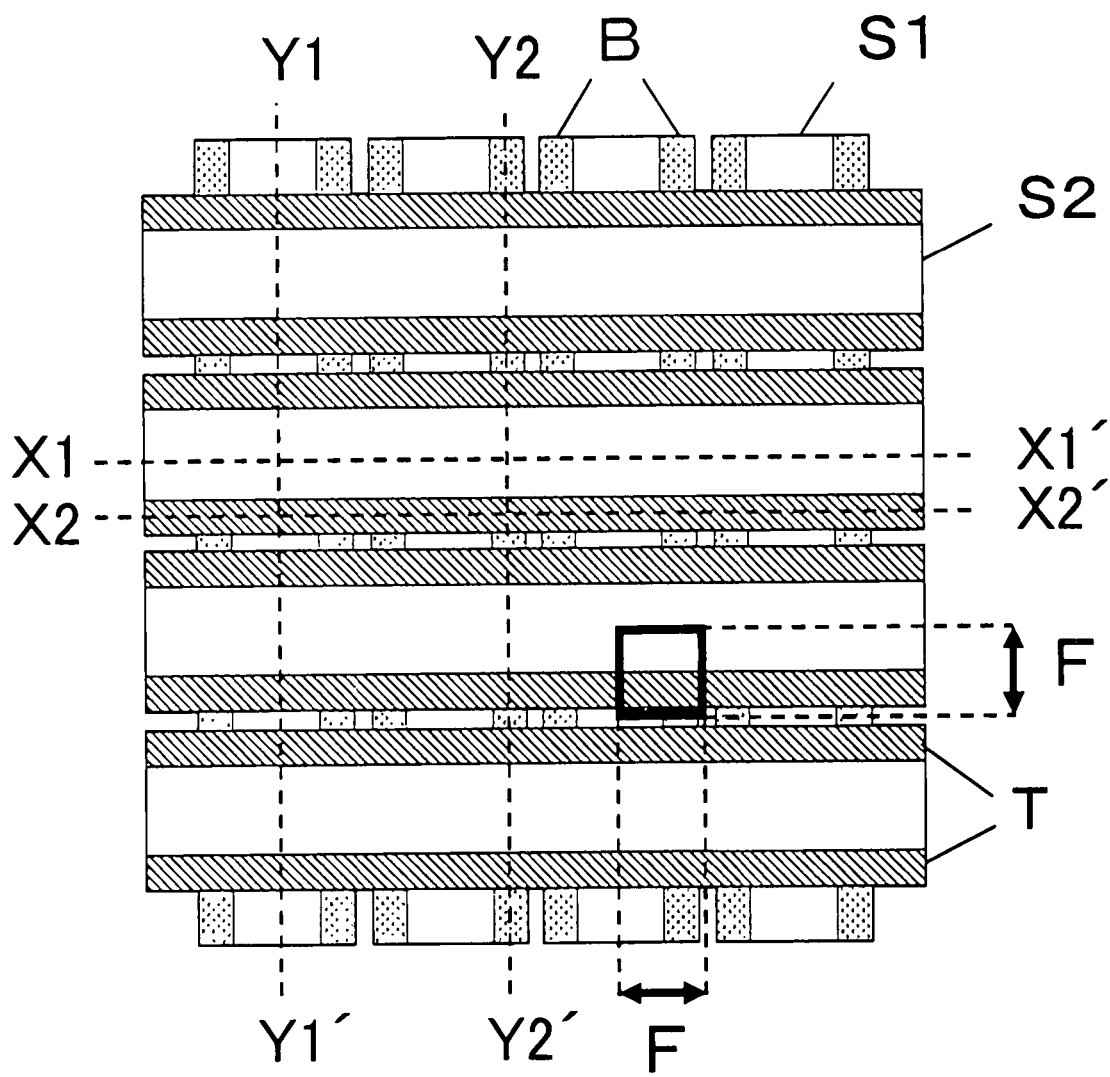
FIG. 2 is a plan view that schematically shows the memory cell array of the semiconductor memory device according to the first embodiment of the present invention.
Figure 3A:
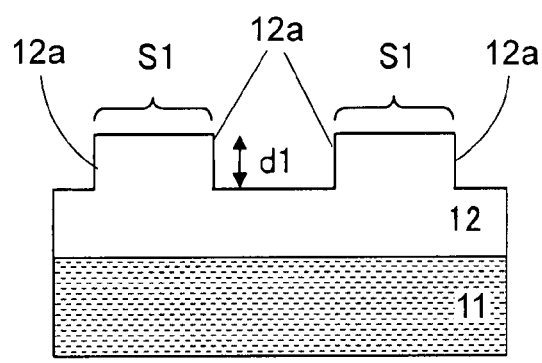
FIGS. 3A to 3D are cross-sectional views that show part of steps of manufacturing the memory cells and the memory cell array of the semiconductor memory device according to the first embodiment of the present invention.
Figure 3B:
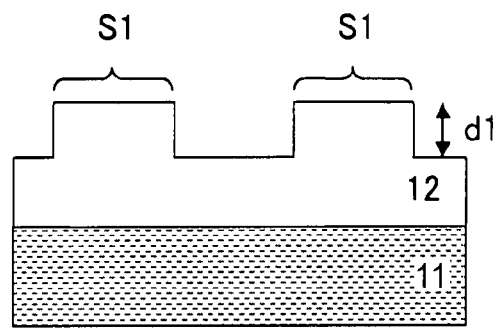
Figure 3C:
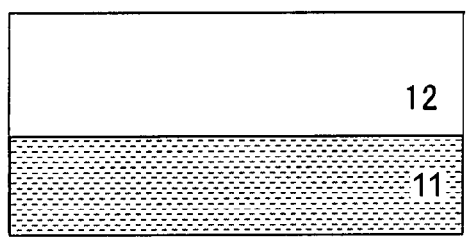
Figure 3D:
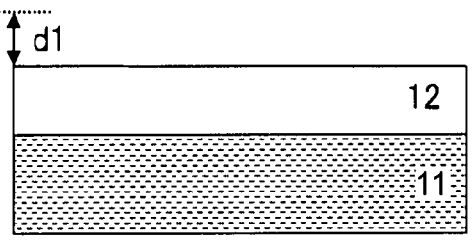

FIG. 2 is a plan view that schematically shows the memory cell array of the semiconductor memory device manufactured by the inventive method based on the layout plan view of FIG. 1. In the first embodiment, the upper electrode interconnectings T and the lower electrode interconnectings B are formed along both sidewall surfaces of the first insulation film pattern S1 and the second insulation film pattern S2 in a self-aligned manner, respectively.

FIGS. 3A-3D to FIGS. 9A-9D show the inventive method in order of steps. In FIGS. 3A to 9D, FIGS. 3A, 4A, ... and 9A are vertical cross-sectional views taken along line X1-X1' of FIG. 2, FIGS. 3B, 4B, ... and 9B are vertical cross-sectional views taken along line X2-X2' of FIG. 2, FIGS. 3C, 4C, ... and 9C are vertical cross-sectional views taken along line Y1-Y1' of FIG. 2, and FIGS. 3D, 4D, ... and 9D are vertical cross-sectional views taken along line Y2-Y2' of FIG. 2. The first embodiment of the inventive method will be described in order of steps.

A first insulation film 12 is deposited on a silicon substrate (semiconductor substrate) 11. In this embodiment, a silicon oxide film having a thickness of 6000 angstroms is deposited as the first insulating film 12 by chemical vapor deposition (CVD). Using a resist patterned by well-known photolithography as a mask, part of the first insulation film 12 is processed by a thickness of d1 by reactive ion etching. In this embodiment, using the resist patterned into stripes of 0.3 μm lines and 0.3 μm spaces, the silicon oxide film 12 is etched by the processing depth of d1 (=1350 angstroms). Thereafter, the resist is removed, thereby forming the first insulation pattern S1 including the silicon oxide film 12 and having perpendicular or substantially perpendicular projections 12a each having a height of d1 as shown in FIGS. 3A to 3D (in step A1). In this embodiment, "perpendicular" means perpendicular to a surface of the semiconductor substrate 11 unless otherwise specified.

Figure 4A:
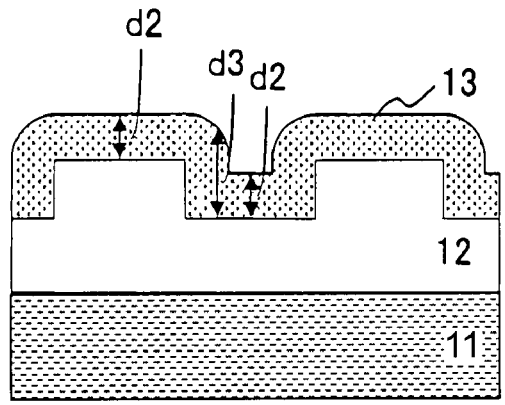
FIGS. 4A to 4D are cross-sectional views that show part of steps of manufacturing the memory cells and the memory cell array of the semiconductor memory device according to the first embodiment of the present invention.
Figure 4B:
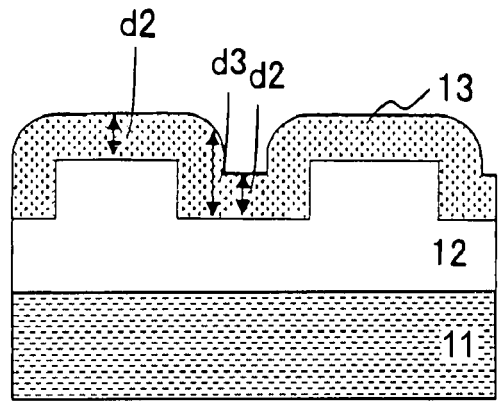
Figure 4C:
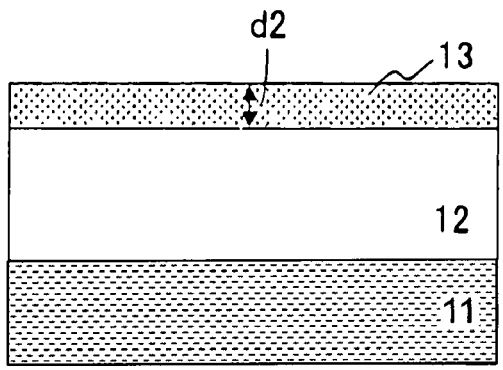
Figure 4D:
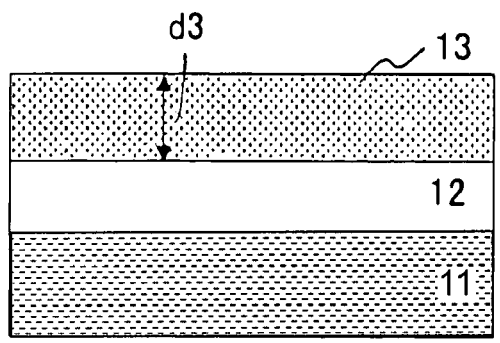
Figure 5A:
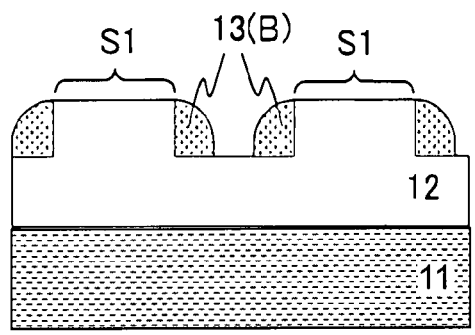
FIGS. 5A to 5D are cross-sectional views that show part of steps of manufacturing the memory cells and the memory cell array of the semiconductor memory device according to the first embodiment of the present invention.
Figure 5B:
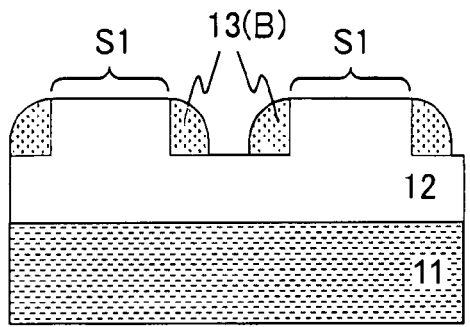
Figure 5C:
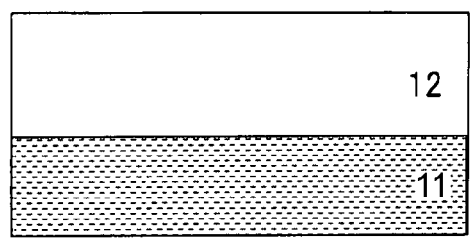
Figure 5D:
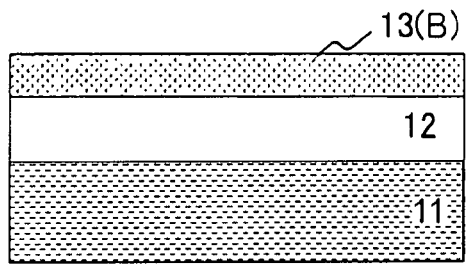
Figure 6A:
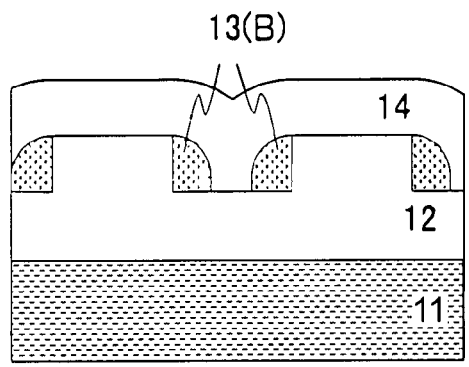
FIGS. 6A to 6D are cross-sectional views that show part of steps of manufacturing the memory cells and the memory cell array of the semiconductor memory device according to the first embodiment of the present invention.
Figure 6B:
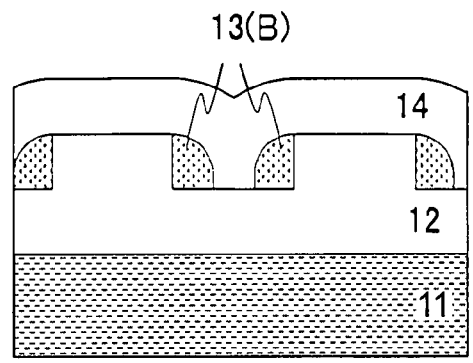
Figure 6C:
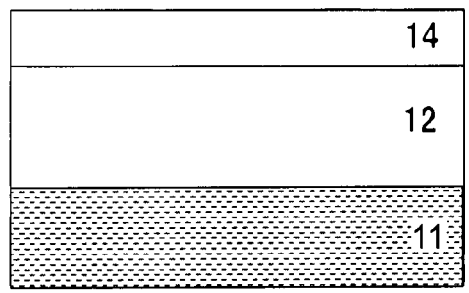
Figure 6D:
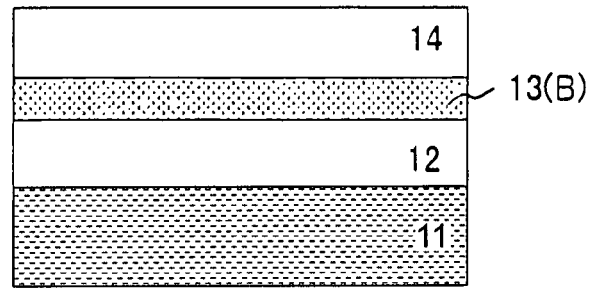
Figure 7A:
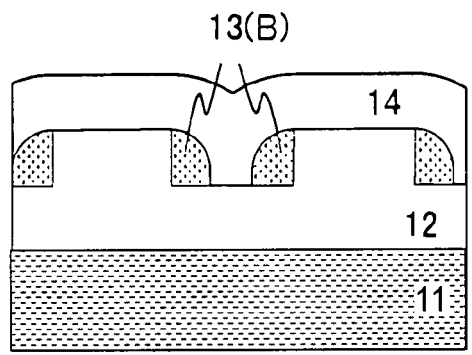
FIGS. 7A to 7D are cross-sectional views that show part of steps of manufacturing the memory cells and the memory cell array of the semiconductor memory device according to the first embodiment of the present invention.
Figure 7B:
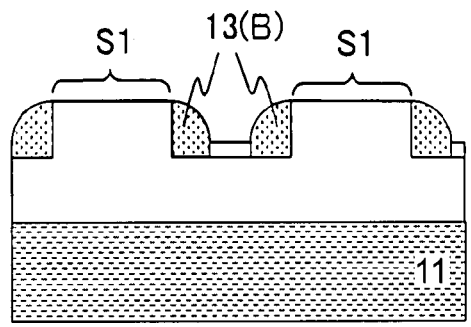
Figure 7C:
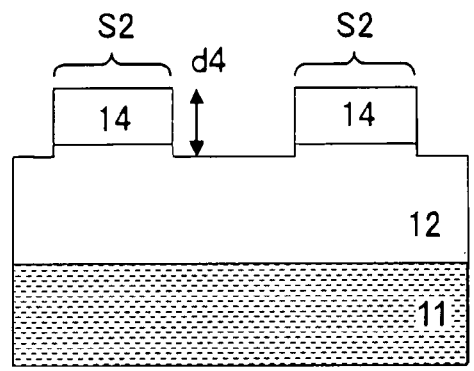
Figure 7D:
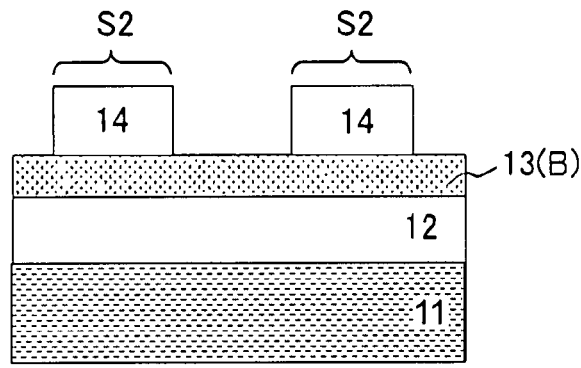

As shown in FIGS. 4A to 4D, a Pt film 13 is deposited as a interconnecting material (first electrode film) for the lower electrode interconnectings B on an entire surface of the first insulation film 12 by sputtering. At this moment, a thickness of the deposited film 13 near a side of each projection of the first insulation film pattern S1 is larger than that of the deposited film 13 on a flat part of the first insulation film pattern S1 because of the height difference d1. In this embodiment, the first electrode film 13 having a thickness of d2 (=1000 angstroms) is sputtered on the first insulation film pattern S1 as shown in FIG. 4C. The thickness of the first electrode film 13 near the side of each projection is thereby set to d3 (=2000 angstroms>d2) as shown in FIG. 4D (in step A2).

The first electrode film 13 deposited in step A2 is etched in a perpendicular direction by reactive ion etching. As described above, the thickness of the first electrode film 13 near the side of each projection of the first insulation film pattern S1 is larger than that of the first electrode film 13 on the flat part of the first insulation film pattern S1 due to the height difference d1. Therefore, the lower electrode interconnectings B including the first electrode film 13 are formed along both sidewall surfaces of the projections 12a in a self-aligned manner as shown in FIGS. 5A to 5D (in step A3).

As shown in FIGS. 6A to 6D, a silicon oxide film 14 is deposited as a second insulation film on the entire surface by the CVD. In this embodiment, the silicon oxide film 14 having a thickness of 1000 angstroms is deposited (in step A4).

Using a resist patterned by the well-known photolithography as a mask, part of the second insulation film 14 is processed by a thickness of d2 by the reactive ion etching. In this embodiment, using the resist patterned into stripes of 0.3 μm lines and 0.3 μm spaces, the silicon oxide film 14 is etched by the processing depth of d4 (=1200 angstroms). Thereafter, the resist is removed, thereby forming the second insulation pattern S2 including the silicon oxide film 14 and having perpendicular or substantially perpendicular projections each having a height of d4 as shown in FIGS. 7A to 7D (in step A5).

Figure 8A:
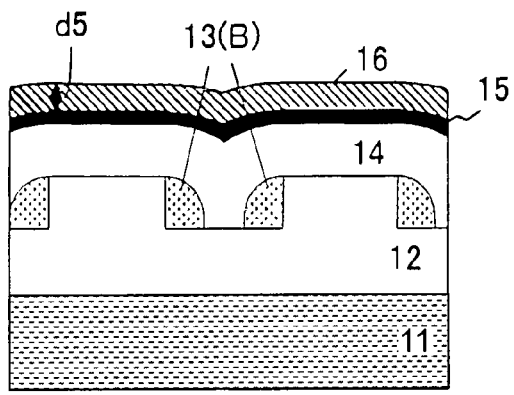
FIGS. 8A to 8D are cross-sectional views that show part of steps of manufacturing the memory cells and the memory cell array of the semiconductor memory device according to the first embodiment of the present invention.
Figure 8B:
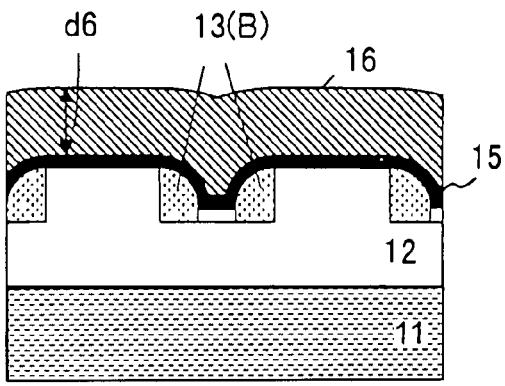
Figure 8C:
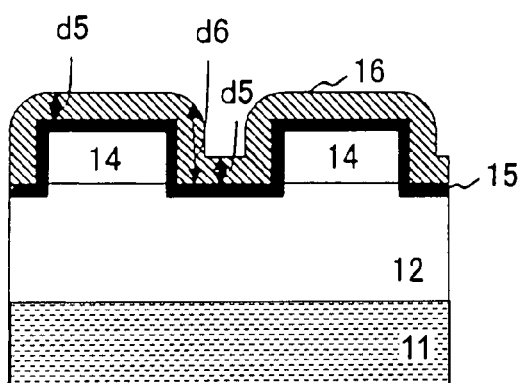
Figure 8D:
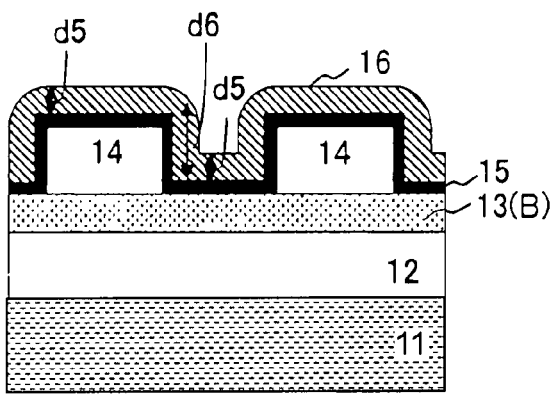
Figure 9A:
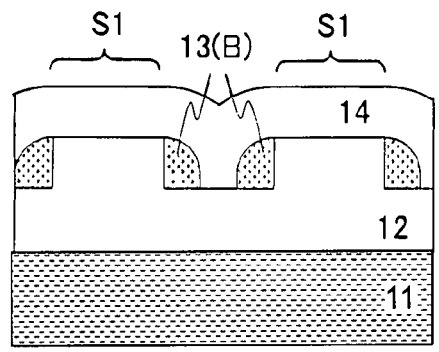
FIGS. 9A to 9D are cross-sectional views that show part of steps of manufacturing the memory cells and the memory cell array of the semiconductor memory device according to the first embodiment of the present invention.
Figure 9B:
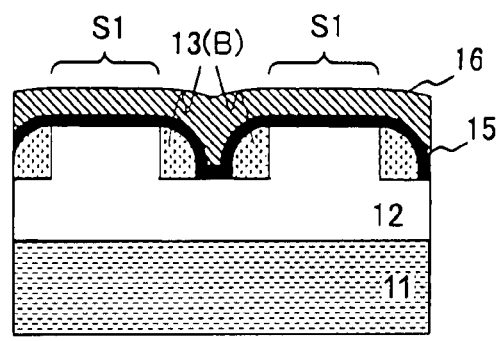
Figure 9C:
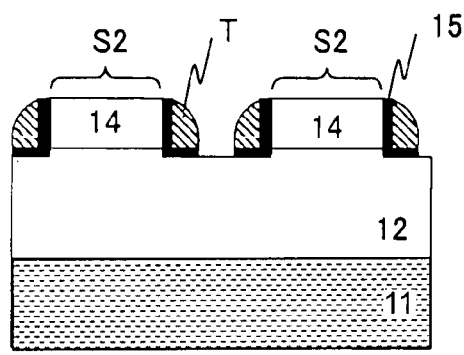
Figure 9D:
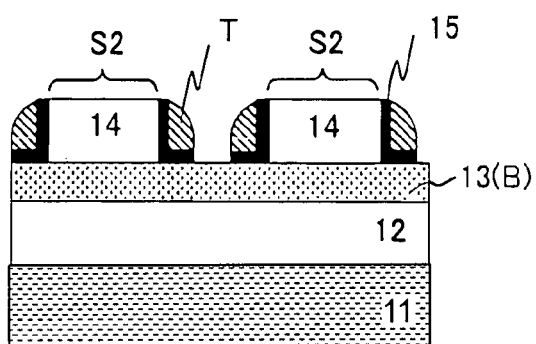

As shown in FIGS. 8A to 8D, a PCMO film 15 that becomes a storage material member that stores data and a Pt film 16 that becomes a interconnecting material (second electrode film) for the upper electrode interconnectings T are formed on the entire surface in this order. In this embodiment, the PCMO film 15 having a thickness of 400 angstroms and the second electrode film 16 having a thickness of 1000 angstroms are deposited in this order. At this moment, a thickness of the deposited film 16 near a side of each projection of the second insulation film pattern S2 is larger than that of the deposited film 16 on a flat part of the second insulation film pattern S2 because of the height difference d4. In this embodiment, the thickness of the second electrode film 16 on the flat part of the second insulation film pattern S2 is 1000 angstroms (d5) as shown in FIG. 8A whereas the thickness of the second electrode film 16 near the side of each projection of the second insulation film pattern S2 is 2000 angstroms (d6) as shown in FIG. 8B (in step A6).

The second electrode film 16 deposited in step A6 is etched in the perpendicular direction by the reactive ion etching. As described above, the thickness of the second electrode film 16 near the side of each projection of the second insulation film pattern S2 is larger than that of the second electrode film 16 on the flat part of the second insulation film pattern S2 due to the height difference d4. Therefore, the upper electrode interconnectings T including the second electrode film 16 are formed along both sidewall surfaces of the projections in a self-aligned manner as shown in FIGS. 9A to 9D. Thereafter, the PCMO film 15 is removed (in step A7).

In this embodiment, after the second insulation film pattern S2 is formed in steps A4 and A5, the PCMO film 15 is formed in step A6. Alternatively, the order may be changed. Namely, after the lower electrode interconnectings B are formed in step A3, the PCMO film 15 is formed, the second insulation film 14 is formed on the PCMO film 15, and the second insulation film pattern S2 including the projections each having the height of d4 may be formed.

In the first embodiment, two types of electrode interconnectings, i.e., the lower electrode interconnectings B and the upper electrode interconnecting pattern T are formed along the both sidewall surfaces of the projections of the first insulation film pattern S1 and the second insulation film pattern S2 using the projections of the first and second insulation film patterns S1 and S2 arranged in the form of stripes, respectively. Due to this, if the first insulation film pattern S1 and the second insulation film pattern S2 are formed according to the minimum processing dimension F, then memory cells in crosspoints between the lower electrode interconnectings B and the upper electrode interconnectings T are repeatedly formed each at a pitch F in a direction of the lower electrode interconnectings B and that of the upper electrode interconnectings T, respectively, as shown in FIG. 2. As a result, an area of one memory cell is "$F^2$" relative to the minimum processing dimension F as indicated by a bold solid line region shown in FIG. 2 as compared with the memory cell area of "$4F^2$" by the conventional manufacturing method. The memory cell area according to this embodiment can be reduced to 25% of the memory cell area according to the conventional technique, thereby making it possible to realize higher integration of memory cells and miniaturization in the manufacturing process.

Second Embodiment

A second embodiment in which the inventive method is applied to formation of upper electrode interconnectings for crosspoint structure memory cells will be described.

Figure 10:
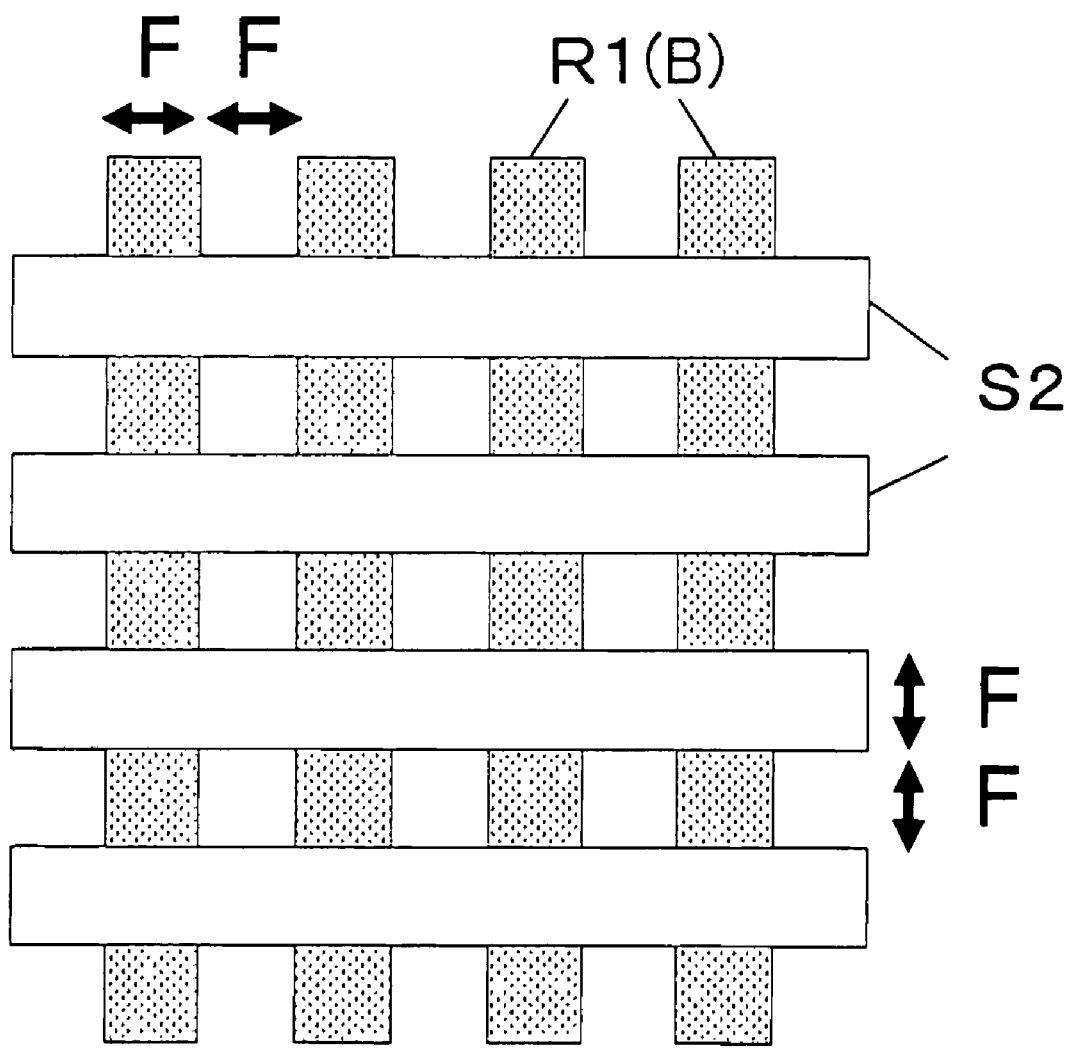
FIG. 10 is a layout plan view for forming memory cells and a memory cell array of a semiconductor memory device according to a second embodiment of the present invention.

FIG. 10 is a layout plan view for forming memory cells and a memory cell array by the inventive method. In FIG. 10, reference symbol R1 denotes a region that defines a interconnecting pattern of the lower electrode interconnectings B, and reference symbol S2 denotes a region that defines the second insulation film pattern necessary to form the upper electrode interconnectings T (see FIG. 11).

Figure 11:
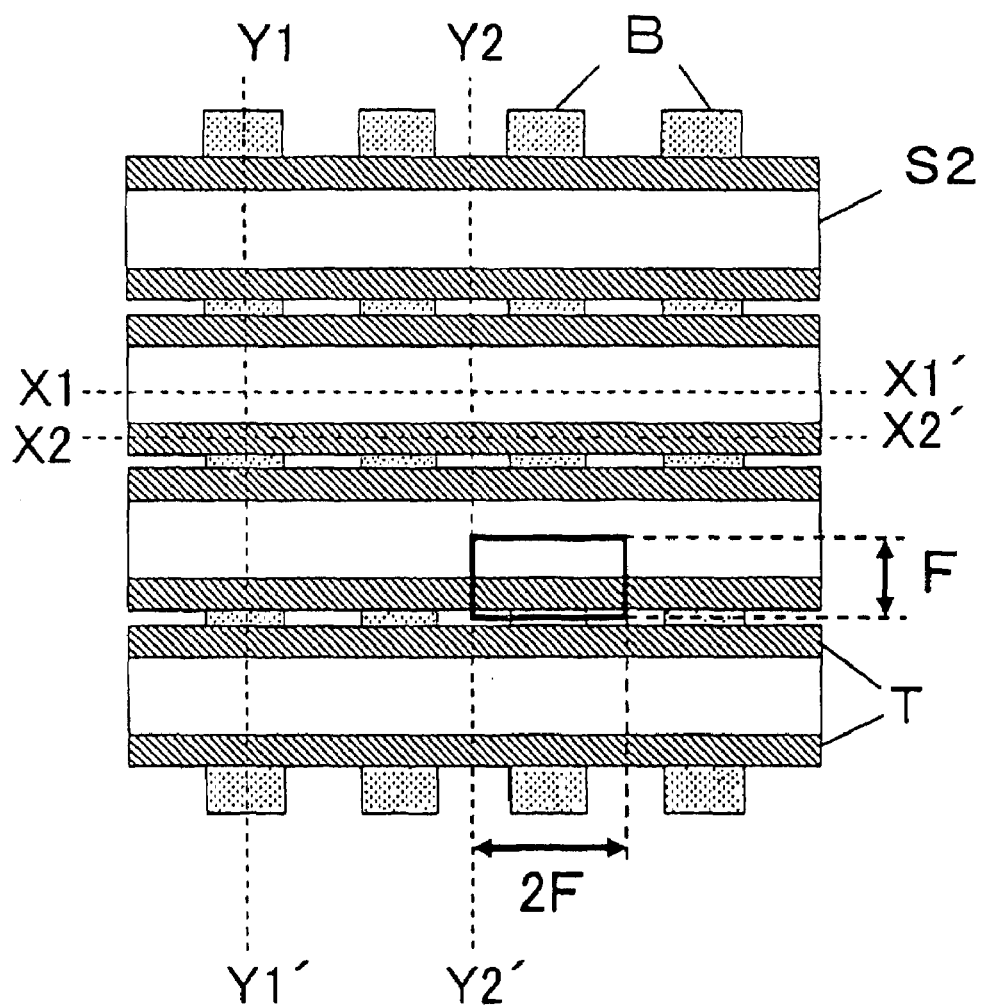
FIG. 11 is a plan view that schematically shows the memory cell array of the semiconductor memory device according to the second embodiment of the present invention.
Figure 12A:
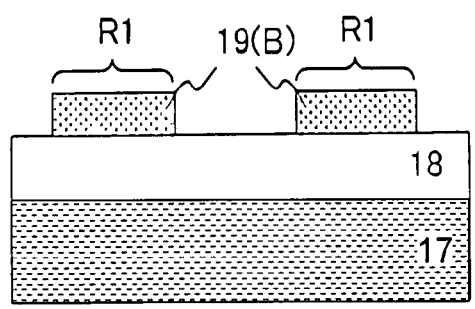
FIGS. 12A to 12D are cross-sectional views that show part of steps of manufacturing the memory cells and the memory cell array of the semiconductor memory device according to the second embodiment of the present invention.
Figure 12B:
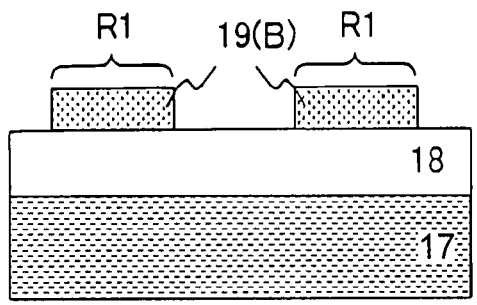
Figure 12C:
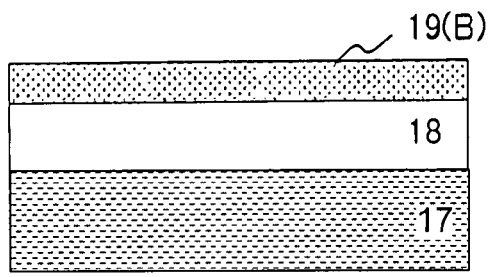
Figure 12D:
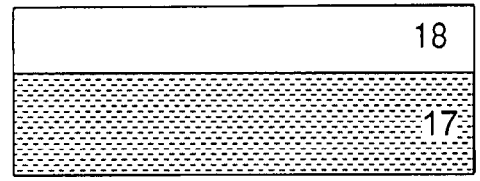
Figure 13A:
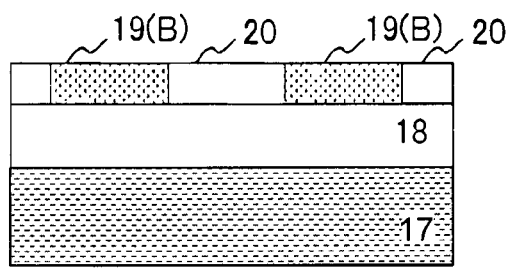
FIGS. 13A to 13D are cross-sectional views that show part of steps of manufacturing the memory cells and the memory cell array of the semiconductor memory device according to the second embodiment of the present invention.
Figure 13B:
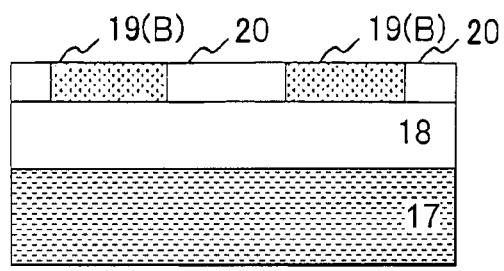
Figure 13C:
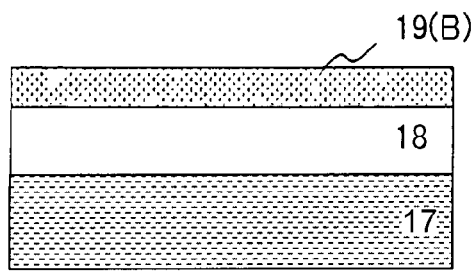
Figure 13D:
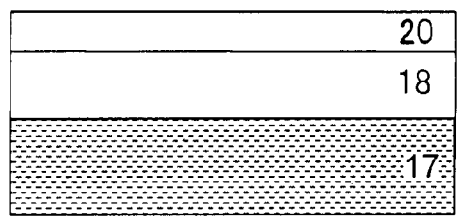
Figure 14A:
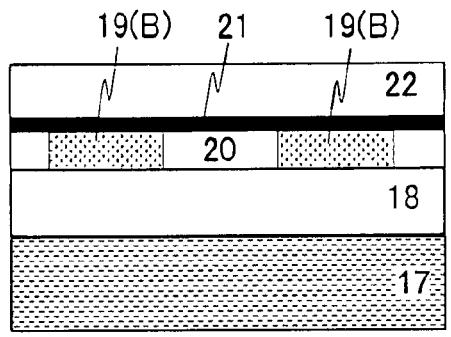
FIGS. 14A to 14D are cross-sectional views that show part of steps of manufacturing the memory cells and the memory cell array of the semiconductor memory device according to the second embodiment of the present invention.
Figure 14B:
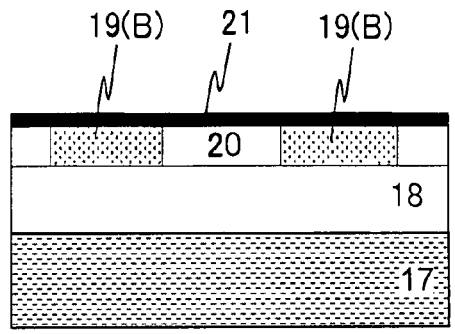
Figure 14C:
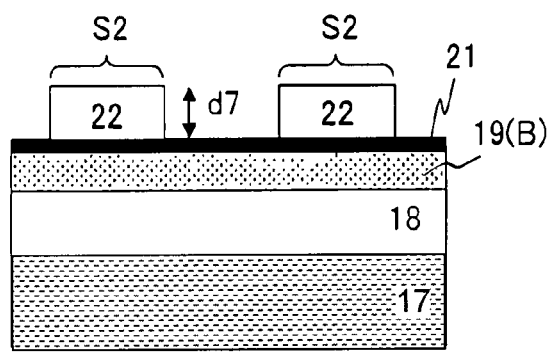
Figure 14D:
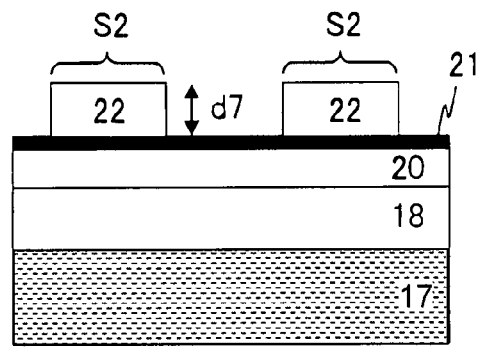

FIG. 11 is a plan view that schematically shows the memory cell array of the semiconductor memory device manufactured by the inventive method based on the layout plan view of FIG. 10. In the second embodiment, the upper electrode interconnectings T are formed along both sidewall surfaces of the second insulation film pattern S2 in a self-aligned manner.

FIGS. 12A-12D to FIGS. 16A-16D show the method according to the second embodiment of the present invention in order of steps. In FIGS. 12A to 16D, FIGS. 12A, 13A, . . . and 16A are vertical cross-sectional views taken along line X1-X1' of FIG. 11, FIGS. 12B, 13B, . . . and 16B are vertical cross-sectional views taken along line X2-X2' of FIG. 11, FIGS. 12C, 13C, . . . and 16C are vertical cross-sectional views taken along line Y1-Y1' of FIG. 11, and FIGS. 12D, 13D, . . . and 16D are vertical cross-sectional views taken along line Y2-Y2' of FIG. 11. The method according to the second embodiment of the present invention will be described in order of steps.

Similarly to the conventional manufacturing method, a first silicon oxide film 18 is formed on an entire surface of a silicon substrate (semiconductor substrate) 17 by the CVD as an interlayer insulating film under the memory cell. A Pt film 19 that becomes an interconnecting material (first electrode film) for the lower electrode interconnectings B is deposited on an entire surface of the first silicon oxide film 18 by sputtering. In this embodiment, the first silicon oxide film 18 having a thickness of 6000 angstroms and the first electrode film 19 having a thickness of 1000 angstroms are deposited in this order. Using a resist patterned into stripes by the well-known photolithography as a mask, the first electrode material 19 is etched, thereby forming the lower electrode interconnecting pattern R1 as shown in FIGS. 12A to 12D (in step B1).

A second silicon oxide film 20 is deposited on the entire surface. In this embodiment, a silicon oxide film having a thickness of 6000 angstroms is deposited by the CVD. Thereafter, the second silicon oxide film 20 is polished down to a surface level of the lower electrode interconnectings B by so-called chemical mechanical polishing (CMP), thereby forming a structure shown in FIGS. 13A to 13D (in step B2). It is noted that the first silicon oxide film 18 and the second silicon oxide film 20 correspond to the first insulation film 12 according to the first embodiment.

A PCMO film 21 that becomes a storage material member that stores data is formed on the entire surface and a third silicon oxide film (second insulation film) 22 is then formed on the entire surface. In this embodiment, the PCMO film 21 having a thickness of 400 angstroms and the second insulation film 22 having a thickness of 1300 angstroms are deposited in this order. Using a resist patterned by the well-known photography as a mask, the second insulation film 22 is processed by the reactive ion etching. In this embodiment, using the resist patterned into stripes of 0.3 µm lines and 0.3 µm spaces, projections having a height of d7 (=1300 angstroms) are formed. Thereafter, the resist is removed, thereby forming the second insulation pattern S2 including the silicon oxide film 22 and having perpendicular or substantially perpendicular projections each having the height of d7 as shown in FIGS. 14A to 14D (in step B3).

As shown in FIGS. 15A to 15D, a Pt film 23 that becomes a interconnecting material (second electrode film) for the upper electrode interconnectings T is deposited on the entire surface by sputtering. At this moment, a thickness of the deposited film 23 near a side of each projection of the second insulation film pattern S2 is larger than that of the deposited film 23 on a flat part of the second insulation film pattern S2 because of the height difference d7. In this embodiment, the second electrode film 23 having a thickness of d8 (=1000 angstroms) is sputtered on the second insulation film pattern S2 as shown in FIG. 15A. The thickness of the second electrode film 23 near the side of each projection is thereby set to d9 (=2000 angstroms>d8) as shown in FIG. 15B (in step B4).

The second electrode film 23 deposited in step B4 is etched in a perpendicular direction by the reactive ion etching. As described above, the thickness of the second electrode film 23 near the side of each projection of the second insulation film pattern S2 is larger than that of the second electrode film 23 on the flat part of the second insulation film pattern S2 due to the height difference d7. Therefore, the upper electrode interconnectings T including the second electrode film 23 are formed along both sidewall surfaces of the projections in a self-aligned manner as shown in FIGS. 16A to 16D (in step B5).

In this embodiment, the second insulation film pattern S2 is formed on the PCMO film 21 in step B3. Alternatively, the order may be changed. Namely, after the second insulation film pattern S2 is formed in step B3, the PCMO film 21 and the second electrode film 23 may be formed in this order.

In the second embodiment, the two upper electrode interconnectings T are formed along the both sidewall surfaces of the projections of the second insulation film pattern S2 using the projections of the second insulation film pattern S2 arranged in the form of stripes, respectively. Due to this, if the first insulation film pattern S1 and the second insulation film pattern S2 are formed according to the minimum processing dimension F, then memory cells in crosspoints between the lower electrode interconnectings B and the upper electrode interconnectings T are repeatedly formed at a pitch F in a direction of the lower electrode interconnectings B and at a pitch 2F in that of the upper electrode interconnectings T, respectively, as shown in FIG. 11. As a result, an area of one memory cell is "$2F^2$" relative to the minimum processing dimension F as indicated by a bold solid line region shown in FIG. 11 as compared with the memory cell area of "$4F^2$" by the conventional manufacturing method. The memory cell area according to this embodiment can be reduced to 50% of the memory cell area according to the conventional technique, thereby making it possible to realize further high integration of memory cells and miniaturization in the manufacturing process.

Third Embodiment

A third embodiment in which the inventive method is applied to formation of lower electrode interconnectings for crosspoint structure memory cells will be described.

Figure 17:
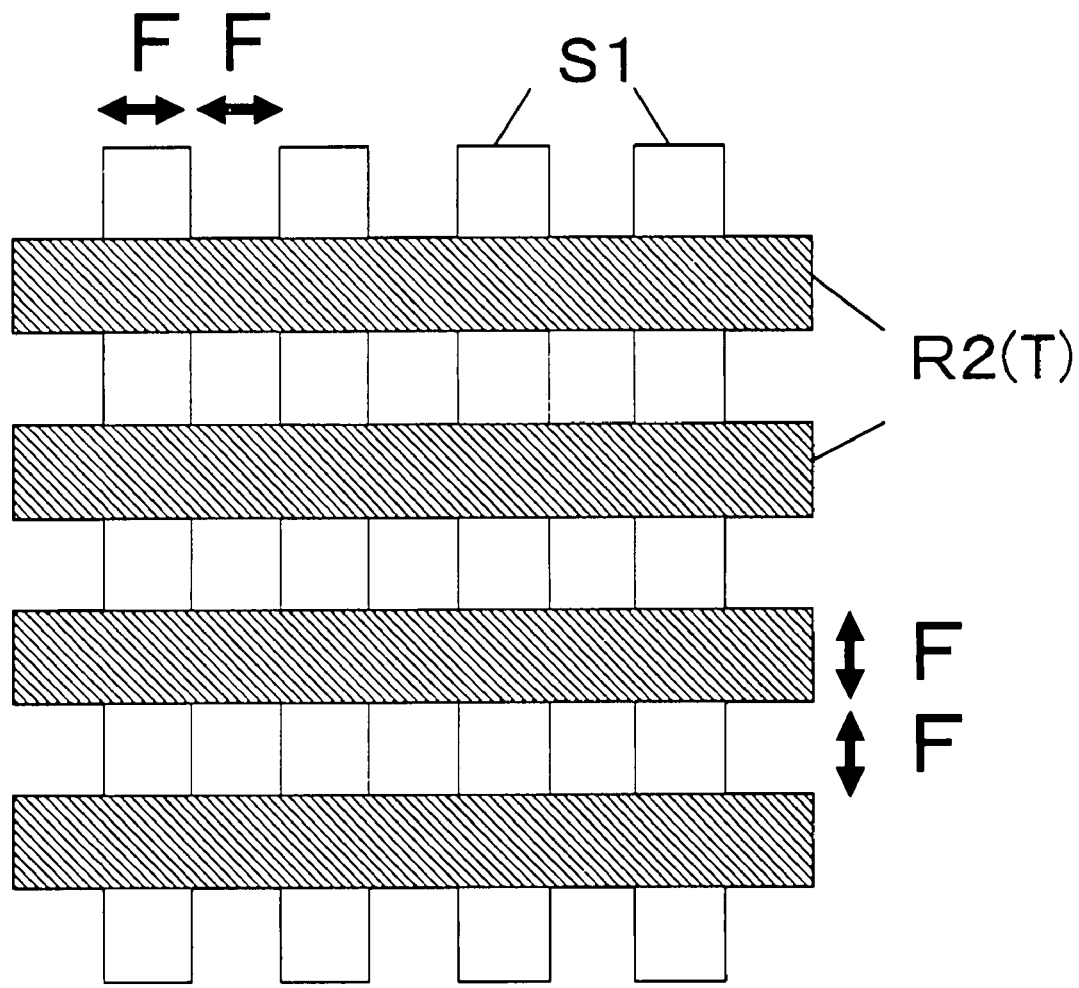
FIG. 17 is a layout plan view for forming memory cells and a memory cell array of a semiconductor memory device according to a third embodiment of the present invention.

FIG. 17 is a layout plan view for forming memory cells and a memory cell array by the inventive method. In FIG. 17, reference symbol S1 denotes a region that defines a first insulation pattern necessary to form the lower electrode interconnectings B (see FIG. 18), and reference symbol R2 denotes a region that defines a interconnecting pattern of the upper electrode interconnectings T.

Figure 18:
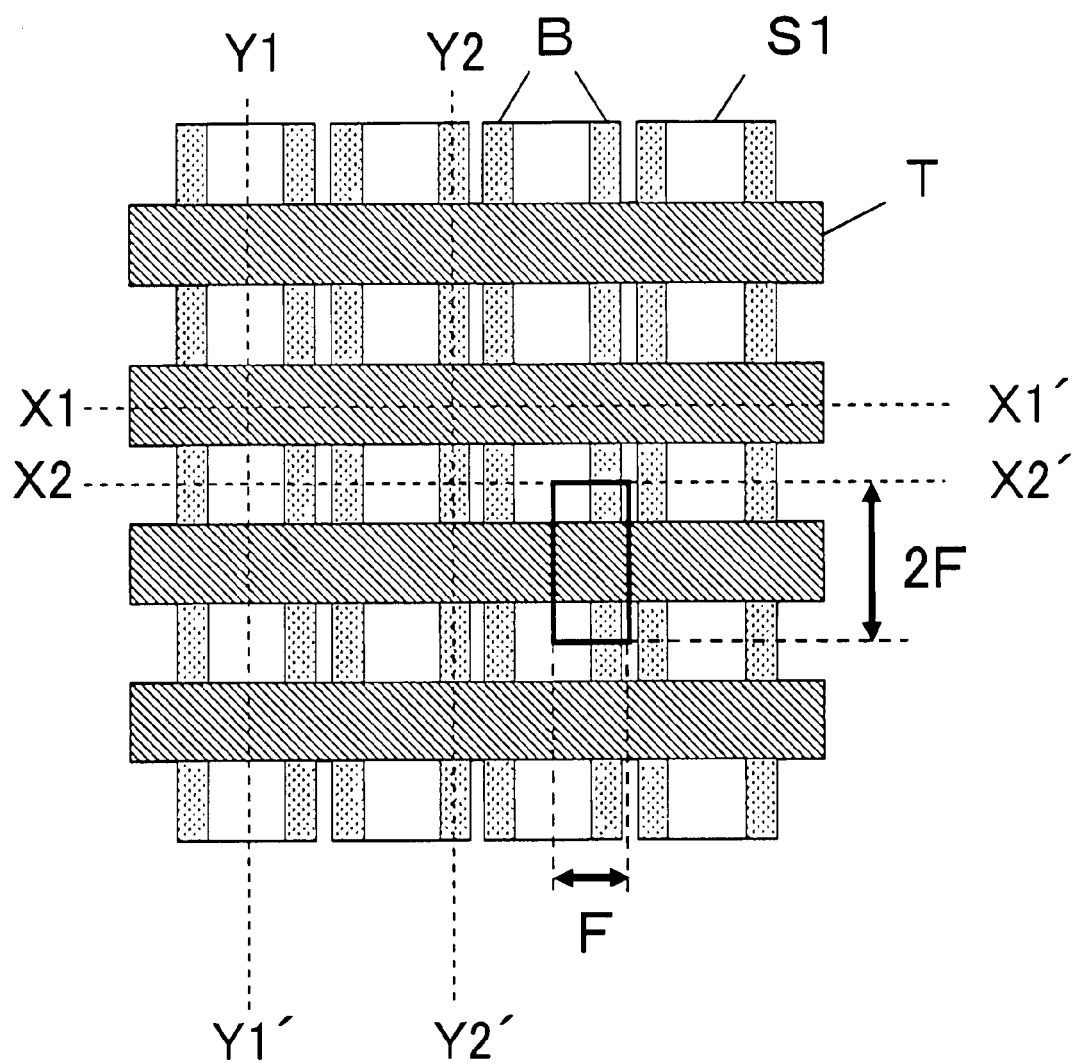
FIG. 18 is a plan view that schematically shows the memory cell array of the semiconductor memory device according to the third embodiment of the present invention.
Figure 19A:
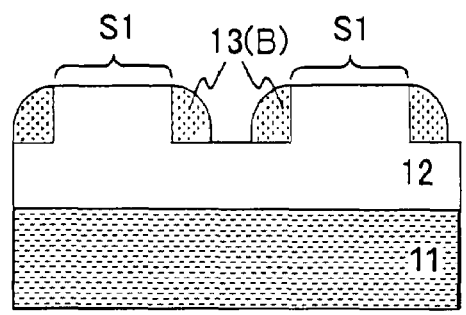
FIGS. 19A to 19D are cross-sectional views that show part of steps of manufacturing the memory cells and the memory cell array of the semiconductor memory device according to the third embodiment of the present invention.
Figure 19B:
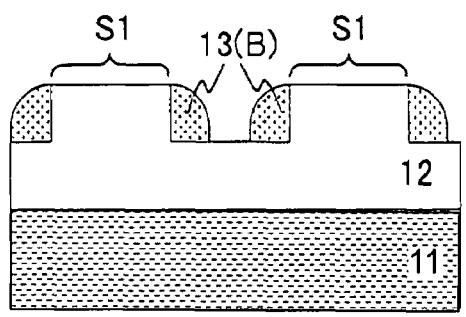
Figure 19C:
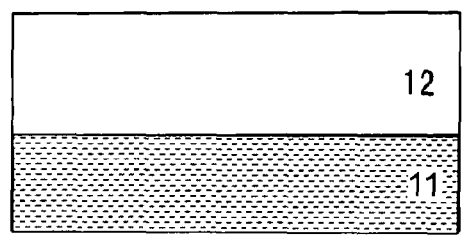
Figure 19D:
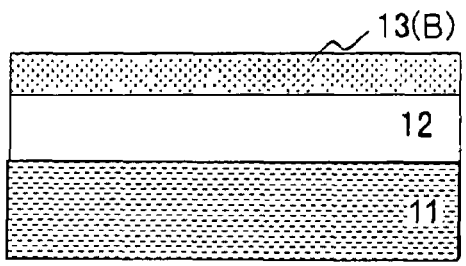
Figure 20A:
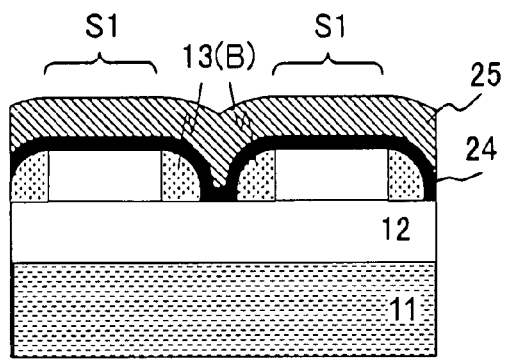
FIGS. 20A to 20D are cross-sectional views that show part of steps of manufacturing the memory cells and the memory cell array of the semiconductor memory device according to the third embodiment of the present invention.
Figure 20B:
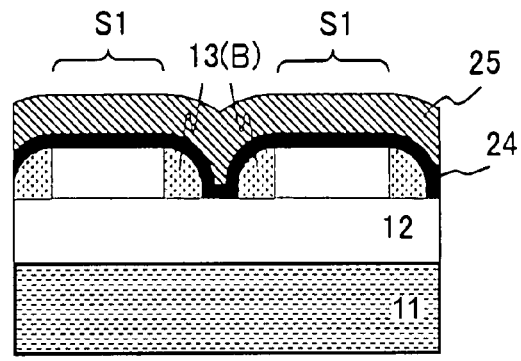
Figure 20C:
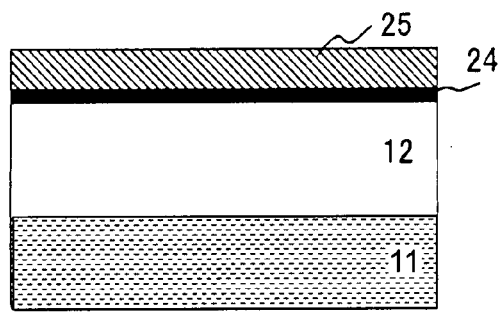
Figure 20D:
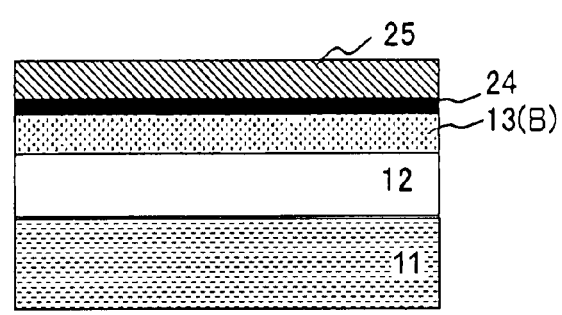
Figure 21A:
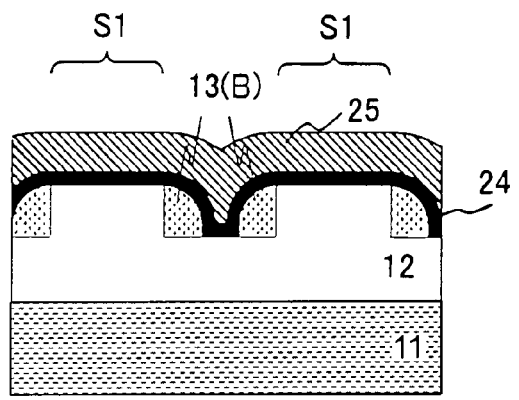
FIGS. 21A to 21D are cross-sectional views that show part of steps of manufacturing the memory cells and the memory cell array of the semiconductor memory device according to the third embodiment of the present invention.
Figure 21B:
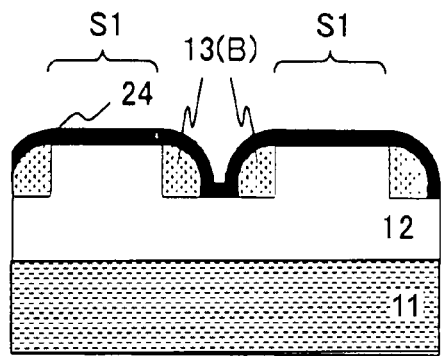
Figure 21C:
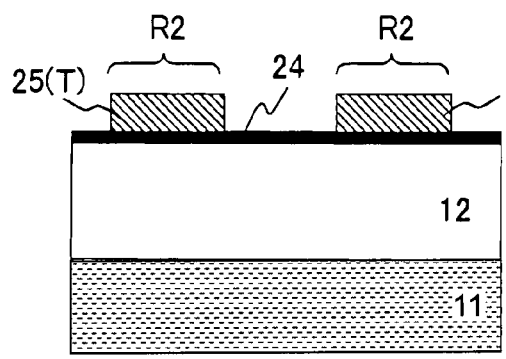
Figure 21D:
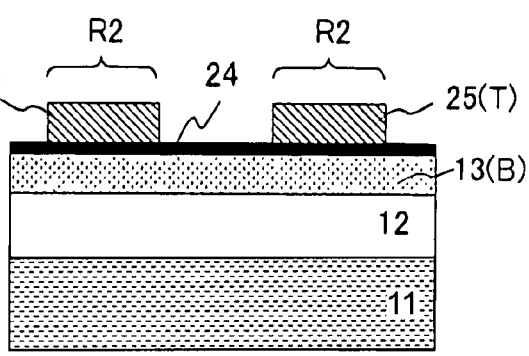
Figure 22:
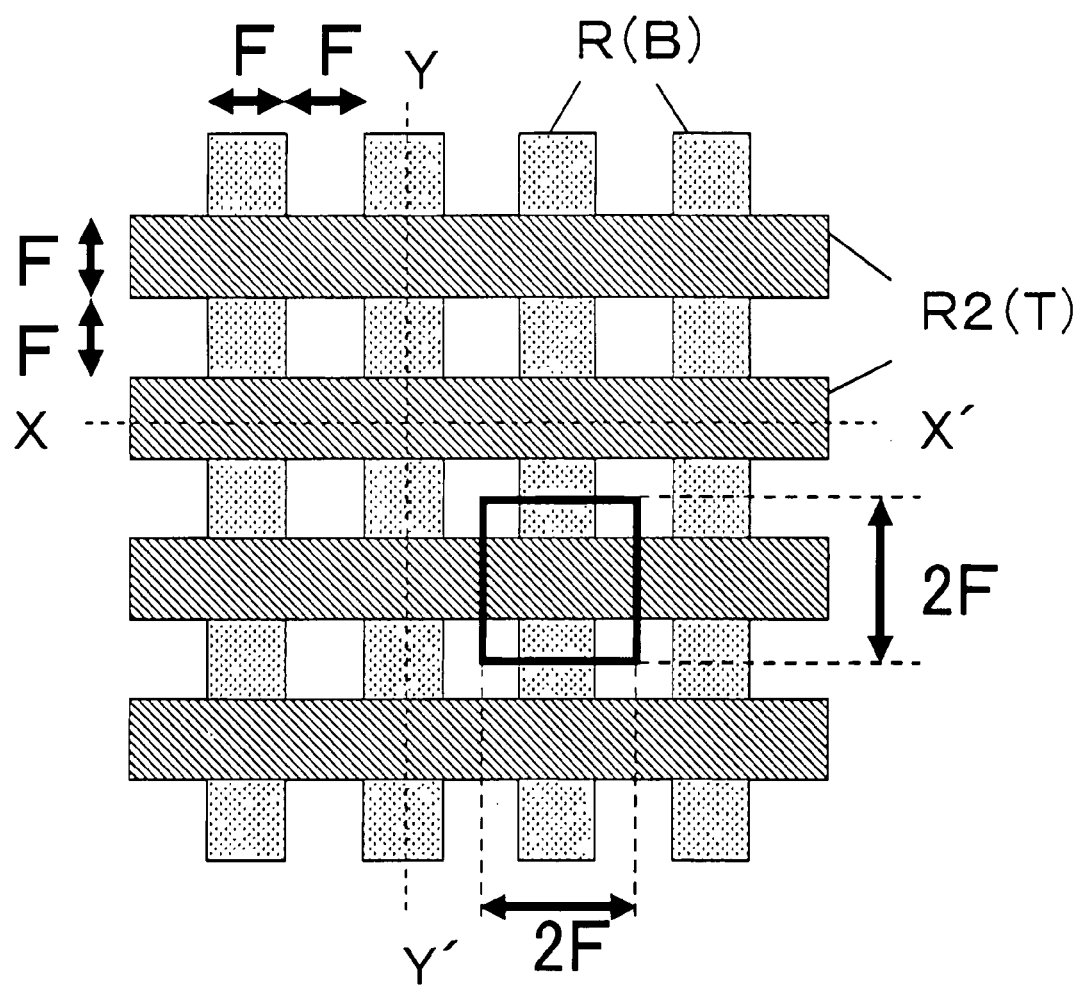
FIG. 22 is a layout plan view for forming memory cells and a memory cell array of a crosspoint structure semiconductor memory device manufactured by a conventional manufacturing method.
Figures 23A, 23B:
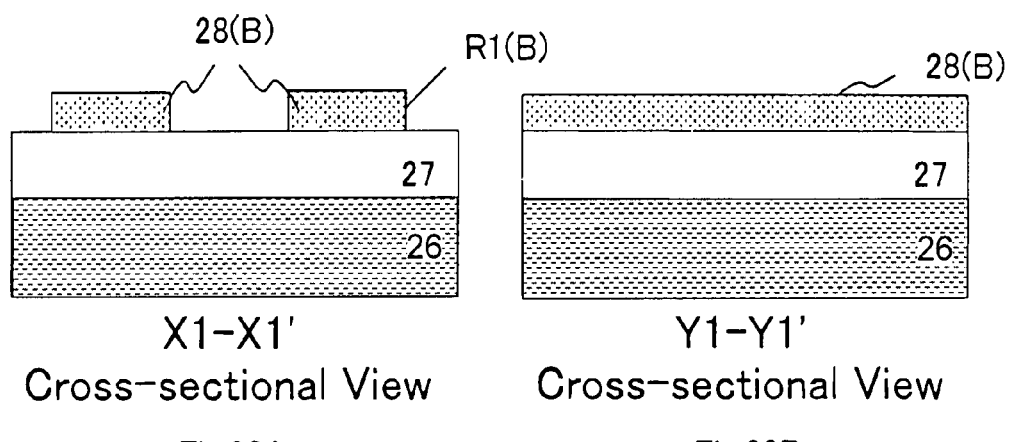
FIGS. 23A and 23B are cross-sectional views that show part of steps of manufacturing the memory cells and the memory cell array of the crosspoint structure memory by the conventional manufacturing method.

FIG. 18 is a plan view that schematically shows the memory cell array of the semiconductor memory device manufactured by the inventive method based on the layout plan view of FIG. 17. In the third embodiment, the lower electrode interconnectings B are formed along both sidewall surfaces of the first insulation film pattern S1 in a self-aligned manner.

FIGS. 19A-19D to FIGS. 21A-21D show the method according to the third embodiment of the present invention in order of steps. In FIGS. 19A to 21D, FIGS. 19A, 20A, and 21A are vertical cross-sectional views taken along line X1-X1' of FIG. 18, FIGS. 19B, 20B, and 21B are vertical cross-sectional views taken along line X2-X2' of FIG. 18, FIGS. 19C, 20C, and 21C are vertical cross-sectional views taken along line Y1-Y1' of FIG. 18, and FIGS. 19D, 20D, and 21D are vertical cross-sectional views taken along line Y2-Y2' of FIG. 18. The method according to the third embodiment of the present invention will be described in order of steps.

Through the same procedures as those for steps A1 to A3 according to the first embodiment, as shown in FIGS. 19A to 19D, the lower electrode interconnectings B including the first electrode film (Pt film) 13 are formed along both sidewall surfaces of projections of the first insulation film pattern S1 in a self-aligned manner (in step C1).

As shown in FIGS. 20A to 20D, a PCMO film 24 and a Pt film 25 that becomes a interconnecting material (second electrode film) for the upper electrode interconnectings T are formed on the entire surface in this order. In this embodiment, the PCMO film 24 having a thickness of 400 angstroms and the second electrode film 25 having a thickness of 1000 angstroms are deposited in this order (in step C2).

As shown in FIGS. 21A to 21D, using a resist patterned into stripes by the well-known photography as a mask, the second electrode film 25 is etched, thereby forming the upper electrode interconnecting pattern R2 (in step C3).

In the third embodiment, two upper electrode interconnectings T are formed along the both sidewall surfaces of the projections of the first insulation film pattern S1 using the projections of the first insulation film pattern S1 arranged in the form of stripes, respectively. Due to this, if the first insulation film pattern S1 and the second insulation film pattern S2 are formed according to the minimum processing dimension F, then memory cells in crosspoints between the lower electrode interconnectings B and the upper electrode interconnectings T are repeatedly formed at a pitch 2F in a direction of the lower electrode interconnectings B and at a pitch F in that of the upper electrode interconnectings T, respectively, as shown in FIG. 18. As a result, an area of one memory cell is "$2F^2$" relative to the minimum processing dimension F as indicated by a bold solid line region shown in FIG. 18 as compared with the memory cell area of "$4F^2$" by the conventional manufacturing method. The memory cell area according to this embodiment can be reduced to 50% of the memory cell area according to the conventional technique, thereby making it possible to realize further high integration of memory cells and miniaturization in the manufacturing process.

A modification of the present invention will be described.

In the preceding embodiments, the instance of using the Pt film as the interconnecting material for the upper electrode interconnectings T and the lower electrode interconnectings B has been described. However, the interconnecting material is not limited to the Pt film according to the embodiments. For example, a multilayer film including Pt and Ti, Pt and $TiO_2$, or the like may be used as the interconnecting material. Alternatively, a composite film including an Ir film, a TiN film, and a Pt film may be used as the interconnecting material.

In the preceding embodiments, the instance of forming the silicon oxide film as each of the first insulation film and the second insulation film has been described. However, the first insulation film and the second insulation film are not limited to the silicon oxide films according to the embodiments. For example, each of the first insulation film and the second insulation film may be a silicon nitride film or the like.

In the preceding embodiments, the RRAM including memory cells configured to use the PCMO film as the storage material member has been described as one example of the semiconductor memory device including crosspoint structure memory cells and manufactured by the inventive method. However, the semiconductor memory device according to the present invention is not limited to the PRAM. Namely, the semiconductor memory device according to the present invention may be the FeRAM including memory cells configured to use a ferroelectric film as the storage material member or the MRAM including memory cells configured to use a TMR film as the storage material member. In either case, a material optimum for the storage material member may be selected as the interconnecting material for each of the upper electrode interconnectings T and the lower electrode interconnectings B. In addition, the storage material member is not limited to the three materials stated above.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A crosspoint structure semiconductor memory device comprising:
    a plurality of upper electrode interconnectings extending in a first direction; and
    a plurality of lower electrode interconnectings extending in a second direction orthogonal to the first direction of said upper electrode interconnectings, wherein
    a storage material member that stores data is formed between said upper electrode interconnectings and said lower electrode interconnectings, and
    at least one pair of said plurality of upper electrode interconnectings or at least one pair of said plurality of lower electrode interconnectings are formed along facing sidewall surfaces of adjacent projections formed into an insulation film processed to have projections, wherein facing sidewalls of the adjacent projections have first and second spaced apart electrode interconnectings formed on respective facing sidewall surfaces of said adjacent projections, and a top surface of each of said first and second spaced apart electrode interconnectings slope toward each other.

2. The crosspoint structure semiconductor memory device according to claim 1, wherein
    said storage material member exhibits a ferroelectric property.

3. The crosspoint structure semiconductor memory device according to claim 1, wherein
    said storage material member exhibits a ferromagnetic tunneling magnetoresistance effect.

4. The crosspoint structure semiconductor memory device according to claim 1, wherein
    said storage material member exhibits a colossal magnetoresistance effect.

5. The crosspoint structure semiconductor memory device according to claim 1, wherein said projections formed in said insulation film are formed in a stripe pattern.

6. The crosspoint structure semiconductor memory device according to claim 1, wherein two discrete lines of said upper electrode interconnectings or said lower electrode interconnectings are formed between the respective facing sidewall surfaces of said adjacent projections.

* * * * *